United States Patent
Sugimoto et al.

(10) Patent No.: US 6,268,646 B1
(45) Date of Patent: *Jul. 31, 2001

(54) LEAD FRAME FOR LEAD ON CHIP

(75) Inventors: Hiroshi Sugimoto; Shigeo Hagiya; Noriaki Taketani; Takaharu Yonemoto; Osamu Yoshioka, all of Ibaraki (JP)

(73) Assignee: Hitachi Cable, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/917,916

(22) Filed: Aug. 27, 1997

(30) Foreign Application Priority Data

Aug. 27, 1996 (JP) .................................................. 8-225546

(51) Int. Cl.⁷ .......................... H01L 23/50; H01L 23/495; H01L 23/02
(52) U.S. Cl. .......................... 257/673; 257/666; 257/676; 257/672; 257/783; 361/760; 174/52.2
(58) Field of Search .................................... 257/666, 676, 257/669–674, 781–784, 787

(56) References Cited

U.S. PATENT DOCUMENTS

| 5,234,866 | | 8/1993 | Okinaga et al. ..................... 438/118 |
| 5,536,970 | * | 7/1996 | Higashi et al. ..................... 257/676 |
| 5,559,305 | * | 9/1996 | Lee et al. .......................... 257/673 |
| 5,677,566 | * | 10/1997 | King et al. ........................ 257/666 |
| 5,714,405 | * | 2/1998 | Tsubosaki et al. ................. 437/206 |
| 5,744,827 | * | 4/1998 | Jeong et al. ...................... 257/686 |
| 5,767,571 | * | 6/1998 | Fimura et al. ..................... 257/673 |
| 5,804,874 | * | 9/1998 | An et al. .......................... 257/676 |
| 5,880,522 | * | 3/1999 | Yonemoto et al. ................. 257/666 |
| 5,897,339 | * | 7/1999 | Song et al. ........................ 438/118 |
| 5,917,242 | * | 6/1999 | Ball ................................... 257/737 |
| 5,945,729 | * | 8/1999 | Stroupe ............................ 257/666 |
| 5,960,258 | * | 9/1999 | Moden .............................. 438/106 |
| 6,018,191 | * | 1/2000 | Murakami et al. ................. 257/670 |
| 6,040,620 | * | 3/2000 | Sugimoto et al. ................. 257/666 |
| 6,046,072 | * | 4/2000 | Matsuura et al. .................. 438/118 |
| 6,107,675 | * | 8/2000 | Sugimoto et al. ................. 257/666 |

FOREIGN PATENT DOCUMENTS

| 4-75355 | | 3/1992 | (JP) . |
| 4-320052 | * | 11/1992 | (JP) ..................................... 257/673 |
| 5-335474 | * | 12/1993 | (JP) ..................................... 257/666 |

* cited by examiner

Primary Examiner—Alexander O. Williams
(74) Attorney, Agent, or Firm—McDermott, Will & Emery

(57) ABSTRACT

A lead frame for LOC to which a semiconductor chip is fixed within a semiconductor chip-mounting region. In addition to applying insulative adhesives to the conventional portions or spots which are on the bottom surfaces of the leading edges of respective inner leads for wire bonding to the pads for the semiconductor ship, the insulative adhesives are applied to other portions of the inner leads in the vicinity of the semiconductor chip-mounting region. Accordingly, the area for bonding the semiconductor chip can be enlarged resulting in improvements in the stability of adhesion between the leads and the semiconductor chip, and in the stabilities of wire bonding and resin molding.

3 Claims, 3 Drawing Sheets

LEAD FRAME FOR LEAD ON CHIP

FIELD OF THE INVENTION

This invention relates to a lead frame used for a semiconductor device, and more particularly, to a lead frame for lead on chip (LOC) used in the semiconductor device to which the molded packaging is conducted with the LOC structure.

BACKGROUND OF THE INVENTION

As a lead frame used for the semiconductor device having the LOC structure and the like which is capable of high density packaging, there is a lead frame in which a thermoplastic or thermosetting adhesive layer (consisting of a high heat-resistant and insulative film having a thickness about 50 $\mu$m and adhesives having about 25 $\mu$m applied on the both surfaces of the film) is formed on one or both faces of the lead frame, and then a semiconductor chip is heated and pressurized to be mounted on the surface of thermoplastic or thermosetting adhesive layer.

In the lead frame, a polyimide film has usually been used for the high heat-resistant and insulative film, and a method for punching the film and applying the punched film to the lead frame has been adopted. Concretely, the film is applied to the lead frame by punching the reel-like wound film to a required shape with a metal tool having a punch and a die, and heating and pressurizing this punched film to the lead film.

However, this method needs a large amount of the film tape used thereby resulting in the increase in cost as well as the waste of the film material due to the punched film refuse. In addition, a crack in the package may develop due to moisture absorption of the polyimide film.

In order to solve such disadvantages, a method for applying a thermoplastic adhesive in the form of varnish to the semiconductor chip mounting area such as the leading edges of respective inner leads and the like on the lead frame using a dispenser has been developed. In particular, in the case of applying an adhesive to the leading edges of the leads, the method of spot application of the adhesive is used. Only a required amount of the adhesive is applied onto the lead frame, so that the remainder of the material does not generate and it does not need an expensive metal mold, resulting in a low production cost.

The application of the varnish-like adhesive is conducted by delivering or emitting the adhesive from a fine needle or nozzle with air pressure to predetermined portions of the lead frame while moving the needle onto the lead frame.

The lead frame has a plurality of inner leads which are centralized to a semiconductor chip-mounting portion and disposed in such a way that they are opposed each other, a plurality of outer leads which are connected to the respective inner leads and disposed in parallel each other, a pair of tie bars which are disposed to connect the respective outer leads on the outside of a resin for sealing the outer leads, and a pair of frame members disposed on both sides thereof to support the tie bars, respectively.

In the lead frame of such a structure, an insulative adhesive is applied to the respective leading edges of the inner leads by the method described above. While heating such inner leads with a heater, the semiconductor chip (not shown) is positioned in a mounting region or area and then the semiconductor chip is pressure-bonded to the insulative adhesive to fix the semiconductor chip thereto. Then, resin molding is applied to the semiconductor chip and inner leads, and the outer leads are bent in required form after cutting them at given positions to complete a semiconductor device.

However, according to the conventional lead frame for LOC, when the insulative adhesive is applied to the lead frame with a dispenser, the region which can be applied with one needle at one time is relatively narrow, so that the adhesive is applied only on a part of the back of the lead silver-plated for wire bonding. As a result, the application of the adhesive is conducted only on the limited area of the lead thereby resulting in an unstable bonded state of the semiconductor chip onto the lead frame. When the resin molding is carried out on the unstably bonded semiconductor chip, the semiconductor chip on the lead frame may incline upon molding, so that resin molding can not be carried out, and unreliable semiconductor devices are fabricated.

SUMMARY OF THE INVENTION

Accordingly, it is an object of the invention to provide a lead frame for lead on chip having an improved stability in the adhesion between a semiconductor chip and a lead, and a stable resin molding.

According to the present invention, a lead frame for lead on chip, comprises: a plurality of inner leads to be connected to a semiconductor chip; a plurality of outer leads to be connected to an outer circuit; and insulative adhesives provided on a plurality of longitudinal positions in a region of said inner leads for mounting a semiconductor chip.

BRIEF DESCRIPTION OF THE DRAWINGS

The present invention will be explained in more detail in conjunction with appended drawings, wherein.

DESCRIPTION OF THE PREFERRED EMBODIMENT

Before explaining a lead frame for LOC in the preferred embodiment according to the present invention, the aforementioned conventional lead frame for LOC will be explained in FIG. 1.

Figure 1:
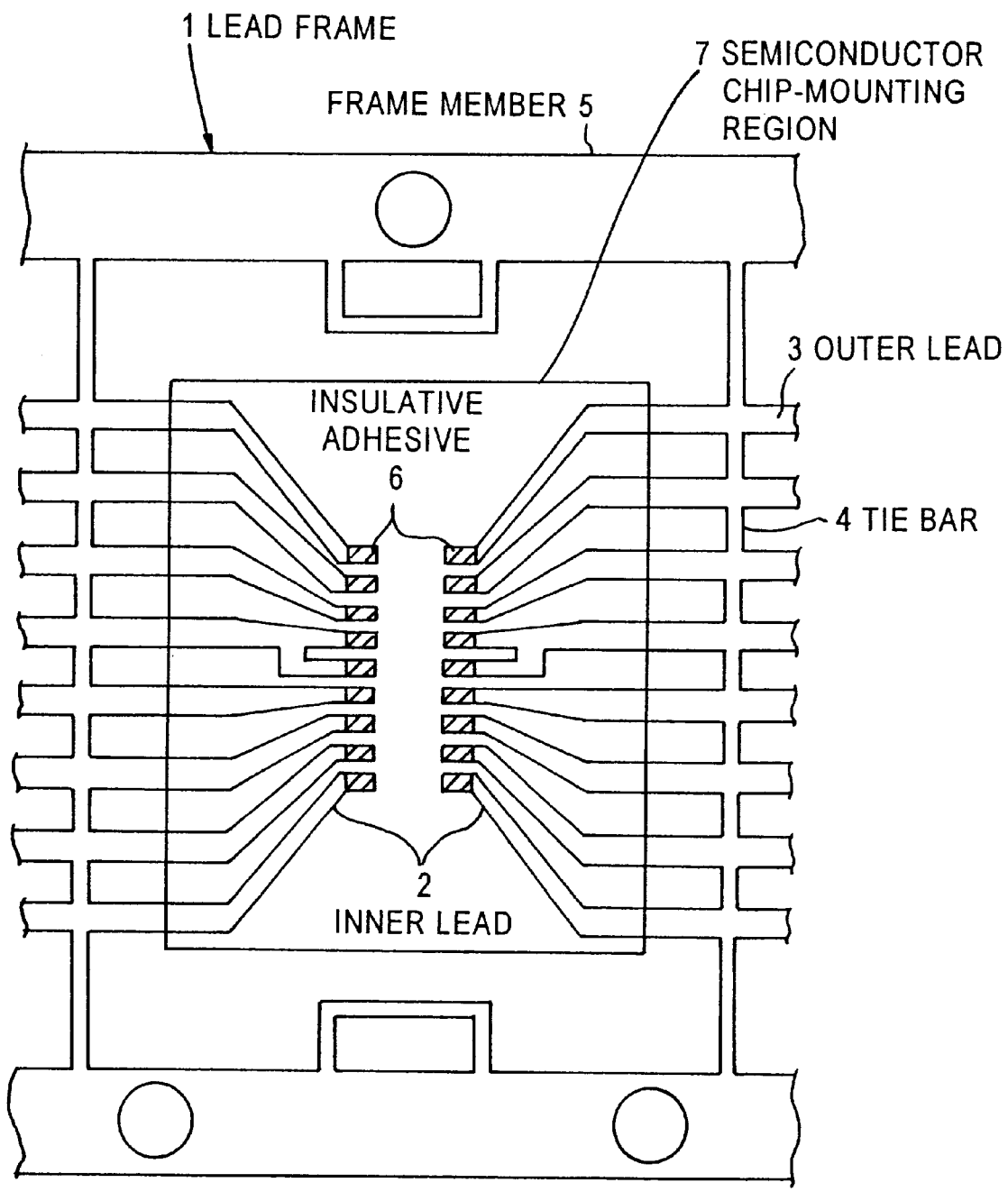
FIG. 1 is a top plane view of a conventional lead frame for LOC having an insulative adhesive applied thereon.

As shown in FIG. 1, a lead frame 1 has a plurality of inner leads 2 which are centralized to a semiconductor chip-mounting region 7 and disposed in such a way that they are opposed each other, a plurality of outer leads 3 which are connected to the respective inner leads 2, a pair of tie bars 4 which are disposed to connect the respective outer leads 3 on the outside of a resin for sealing the outer leads 3 with resin, and a pair of frame members 5 disposed on both sides thereof to support the tie bars 4, respectively.

In the lead frame of such a structure, an insulative adhesive 6 is applied to leading edges of the respective inner leads 2 by the method described above. While heating such inner leads 2 with a heater, the semiconductor chip (not shown) is positioned in the mounting region 7 and then the semiconductor chip is pressure-bonded to be fixed to the insulative adhesive portions 6. Then, resin molding is applied to the semiconductor chip and inner leads, and the outer leads are bent in required form after cutting them at given positions to complete a semiconductor device.

Next, a lead frame for LOC in the preferred embodiment according to the present invention will be explained referring to FIG. 2.

Figure 2:
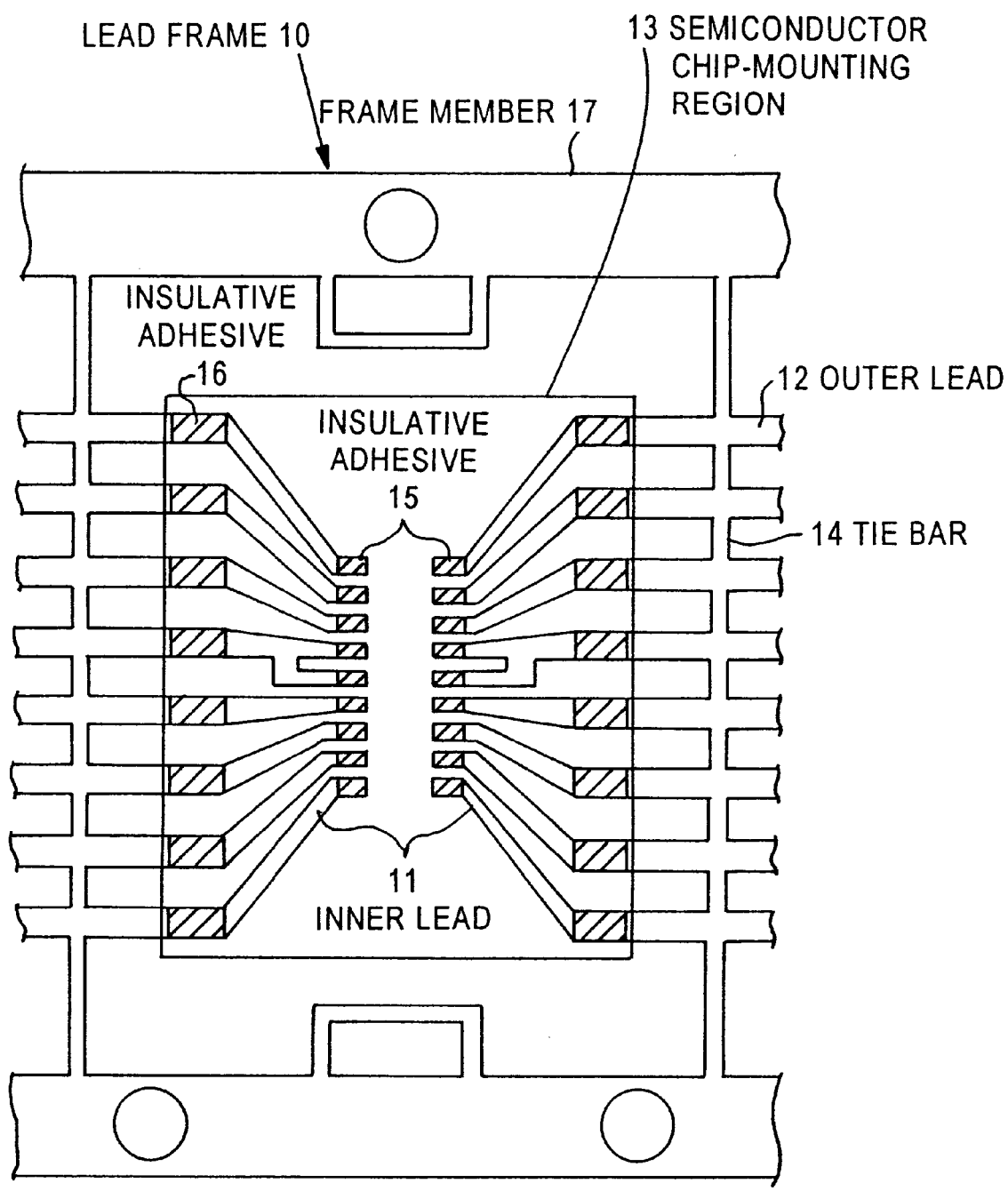
FIG. 2 is a top plane view of a lead frame for LOC in the preferred embodiment according to the present invention.

As shown in FIG. 2, the lead frame 10 is mainly composed of inner leads 11 and outer leads 12. The inner leads 11 are disposed in two parallel rows in such a way that they are centralized to the center portion of a semiconductor chip-mounting region 13 in opposition to each other. Other ends of the inner leads 11 are disposed in such a way that they extend toward the outer leads 12 while widening their spacings, and their terminuses are connected to the outer leads 12, respectively. The outer leads 12 are disposed in parallel each other with a constant spacing, and their beginning portions are connected to each other by tie bars 14. The pair of the tie bars 14 are connected to frame members 17, respectively, in opposite sides.

Insulative adhesives 15 are applied to the back of each of the silver-plated sites, to which bonding wires are bonded, in leading edges of the inner leads 11, and insulative adhesives 16 are applied to the portions in the vicinity of the semiconductor chip-mounting region 13, (that is, the vicinity of the boundary between the inner leads 11 and the outer leads 12). The insulative adhesives 15 and 16 contain a resin material, and is produced by dissolving a thermoplastic adhesive having a glass transition temperature of 220° C. to the form of varnish with a solvent. Preferably, the varnish used in the present invention has a viscosity of about 10,000 cp and a solid content of about 20%.

The insulative adhesives 15 and 16 are applied in the form of varnish with a dispenser. The dispenser comprises a vessel containing the varnish-formed insulative adhesive, a pressurizing means for supplying air to the vessel, a needle connected to the leading edge of the vessel, and a driving means for moving the needle on the lead frames in the direction of applying the adhesive. The insulative adhesive from the needle is delivered on the inner leads 11 by pressure-supplying air into the vessel, and the insulative adhesive layers or coatings 15 and 16 are formed on the inner leads 11 by moving the needle in turn toward the adjacent inner leads 11.

In this way, by applying the insulative adhesives to two spots on the surfaces of the respective leads, the positive fixation of the semiconductor chip, that is, the improvements in the stabilities of adhesion, wire bonding and resin molding can be obtained. Although the insulative adhesives are applied to two spots, it can be applied to the spots more than two.

Figure 3:
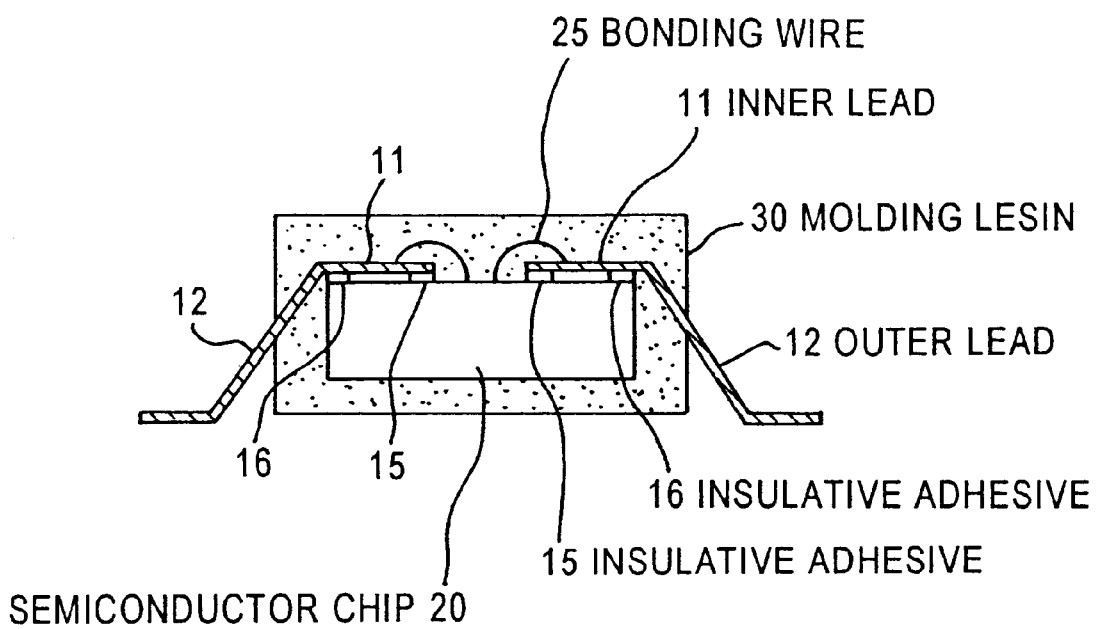
FIG. 3 is a cross-sectional view showing a semiconductor package using a lead frame in the preferred embodiment according to the invention as shown in FIG. 2.

FIG. 3 shows a semiconductor package using the lead frame as shown in FIG. 2. In the semiconductor package, the inner leads 11 are fixed on a semiconductor chip 20 by the insulative adhesives 15 and 16, and are connected to pads (not shown) of the semiconductor chip 20 by bonding wires 25, and the inner leads 11, the semiconductor chip 20, and the bonding wires 25 are sealed by a molding resin 30. The outer leads 12 which are integral with the inner leads 11 are extended through and out of the molding resin 30 to be connected to a printed circuit board (not shown).

As understood from the description of the preferred embodiment, according to this construction, a bonding area of the semiconductor chip can be enlarged because the bonding area is provided in the vicinity of the semiconductor chip-mounting region, etc. in addition to the conventional wire bonding area. Therefore, improvements in the stability of adhesion between the leads and the semiconductor chip, and in the stability of wire bonding and resin molding can be obtained. One of the two insulative adhesive-applying spots provided on the inner lead in its longitudinal direction can be provided on the back of the leading edge of the inner lead for wire bonding. The other one of the two insulative adhesive-applying spots in the longitudinal direction of the inner lead can be provided in the vicinity or the periphery of the semiconductor chip-mounting region.

This construction is effective in enlarging the area for bonding the semiconductor chip by applying the adhesives to the separate portions such as the periphery of the semiconductor chip-mounting region to stably fix it, because the insulative adhesive applying portion for the conventional inner lead is considerably narrow in the area for bonding the semiconductor chip, compared with the size of the semiconductor chip.

As described above, the insulative adhesive-applying portions of the inner leads are provided in plural spots on the leads within the semiconductor chip-mounting region in the present invention, so that the area for bonding the semiconductor chip can be enlarged resulting in improvements in the stability of adhesion between the leads and the semiconductor chip, and in the stabilities of wire bonding and resin molding.

The preferred embodiments of the present invention have been disclosed by way of examples and it will be understood that other modifications may occur to those skilled in the art without departing from the scope and the spirit of the appended claims.

What is claimed is:

1. A lead frame for lead on chip, for mounting a single semiconductor chip in a chip mounting region of the lead frame, said lead frame comprising:

a plurality of inner leads to be connected to said single semiconductor chip, said plurality of inner leads being arranged in opposing pairs with a first inner lead of each opposing pair having an inner tip and disposed in a central portion of the chip mounting region and extending outward from said central portion in a first direction and a second inner lead of each opposing pair having an inner tip end disposed in the central portion of the chip mounting region, opposed to the tip end of the first inner lead, and extending outward from said central portion in a second direction, opposed to the first direction;

a plurality of outer leads to be connected to an outer circuit; and a varnish-like insulative adhesive provided on at least two longitudinal positions of each of the first and second inner leads of each opposing pair of inner leads for mounting said single semiconductor chip to said lead frame, said at least two longitudinal positions of each of the first and second inner leads of each opposing pair of inner leads being covered by said single semiconductor chip when said single semiconductor ship is mounted to said lead frame in said chip mounting region.

2. The lead frame as defined in claim 1, wherein:
   said varnish-like insulative adhesive is provided on the bottom plane of a tip portion of said respective inner leads, the top plane of said tip portion of said respective inner leads being connected to said semiconductor chip by a bonding wire.

3. The lead frame as defined in claim 1, wherein:
   said varnish-like insulative adhesive is provided on a peripheral area of said region.

* * * * *